US008365409B2

(12) United States Patent
Kakiuchi et al.

(10) Patent No.: US 8,365,409 B2
(45) Date of Patent: Feb. 5, 2013

(54) HEAT EXCHANGER AND METHOD OF MANUFACTURING THE SAME

(75) Inventors: Eisaku Kakiuchi, Toyota (JP); Yasuji Taketsuna, Okazaki (JP); Masahiro Morino, Okazaki (JP); Yuya Takano, Nishio (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 13/258,602

(22) PCT Filed: May 22, 2009

(86) PCT No.: PCT/JP2009/059399
§ 371 (c)(1),
(2), (4) Date: Sep. 22, 2011

(87) PCT Pub. No.: WO2010/134191
PCT Pub. Date: Nov. 25, 2010

(65) Prior Publication Data
US 2012/0012295 A1    Jan. 19, 2012

(51) Int. Cl.
*B21D 11/10*  (2006.01)
*B21D 13/02*  (2006.01)
(52) U.S. Cl. ............... 29/890.053; 29/890.03; 165/185; 165/157
(58) Field of Classification Search ............. 29/890.053, 29/890.03, 525.11, 514; 165/185, 182, 168, 165/169, 170, 171, 177, 184, 179, 181, 183, 165/80.1, 80.2, 80.4, 109.1, 157
See application file for complete search history.

(56) References Cited

U.S. PATENT DOCUMENTS

| 4,638,858 | A | * | 1/1987 | Chu | 165/185 |
| 5,406,698 | A | * | 4/1995 | Lipinski | 29/727 |
| 5,726,495 | A | * | 3/1998 | Aihara et al. | 257/722 |
| 6,520,248 | B2 | * | 2/2003 | Gailus et al. | 165/80.3 |

(Continued)

FOREIGN PATENT DOCUMENTS

JP    07-288391 A    10/1995
JP    10-190268 A    7/1998

(Continued)

OTHER PUBLICATIONS

Office Action dated Feb. 24, 2012 of German Patent Application No. 11 2009 004 795.5 and English translation thereof.

(Continued)

*Primary Examiner* — David Bryant
*Assistant Examiner* — Jason L Vaughan
(74) *Attorney, Agent, or Firm* — Kenyon & Kenyon LLP

(57) ABSTRACT

A heat exchanger is provided with a cooling fin including a plurality of fin portions and a base portion supporting the fin portions, and a plurality of pins press-fitted into the fin portions. In the heat exchanger the pins each having a wider width than each space between the fin portions formed in advance in parallel straight shapes are press-fitted into the spaces in a direction from a top end of each fin portion toward the base portion. Accordingly, the fin portions are formed into corrugated shapes by plastic deformation, thereby fixing the pins between the fin portions in positions apart from the base portion. In each space the pins are arranged at intervals in a longitudinal direction of each space. The pins arranged in adjacent spaces are placed with a displacement in alternating pattern.

6 Claims, 9 Drawing Sheets

U.S. PATENT DOCUMENTS

| | | | |
|---|---|---|---|
| 6,883,597 B2 * | 4/2005 | Thors et al. | 165/133 |
| 7,500,309 B2 * | 3/2009 | Lang et al. | 29/890.03 |
| 2004/0244947 A1 | 12/2004 | Chen | |
| 2008/0179972 A1 * | 7/2008 | Aoki et al. | 310/52 |
| 2008/0235950 A1 * | 10/2008 | Thors et al. | 29/890.046 |
| 2009/0025916 A1 * | 1/2009 | Meshenky et al. | 165/151 |
| 2009/0114372 A1 * | 5/2009 | Ippoushi et al. | 165/104.14 |
| 2010/0276135 A1 | 11/2010 | Morino et al. | |

FOREIGN PATENT DOCUMENTS

| | | |
|---|---|---|
| JP | 10-200278 A | 7/1998 |
| JP | 11-090560 A | 4/1999 |
| JP | 2001-308232 A | 11/2001 |
| JP | 2002-098454 A | 4/2002 |
| JP | 2002-299528 A | 10/2002 |
| JP | 2004-071941 A | 3/2004 |
| JP | 2004-092942 A | 3/2004 |
| JP | 2004-144460 A | 5/2004 |
| JP | 2007-110025 A | 4/2007 |
| JP | 2009-147107 A | 7/2009 |
| JP | 2010-021311 A | 1/2010 |
| JP | 2010-025521 A | 2/2010 |
| JP | 2010-101596 A | 5/2010 |

OTHER PUBLICATIONS

International Search Report dated Jun. 16, 2009 of PCT/JP2009/059399.

* cited by examiner

HEAT EXCHANGER AND METHOD OF MANUFACTURING THE SAME

CROSS-REFERENCE TO RELATED APPLICATIONS

This is a national phase application based on the PCT International Patent Application No. PCT/JP2009/059399 filed on May 22, 2009, the entire contents of which are incorporated herein by reference.

TECHNICAL FIELD

The present invention relates to a heat exchanger to be used in for example a cooling device for cooling a power converter, and a method of manufacturing the heat exchanger.

BACKGROUND ART

A power converter to be mounted in a hybrid electric vehicle, an electric vehicle, and others is conventionally arranged to include a semiconductor device and an electric component for power conversion. Since the semiconductor device and others generate a large amount of heat during operation, the converter is provided with a cooling device to ensure heat dissipation characteristics. Herein, the cooling device is configured to contain heat dissipating fins in a cooling case and cause a coolant (a cooling medium) to flow in the cooling case to dissipate the heat generated in the semiconductor device and others into the coolant through the heat dissipating fins. This type of heat dissipating fins is disclosed in for example Patent Literature 1 listed below in which a plurality of heat dissipating fins are formed in parallel to a heat dissipating base plate.

Herein, as a technique to enhance a cooling performance of the heat dissipating fins (the cooling fin) as mentioned above, the present applicant has proposed a new "cooling fin and a method of manufacturing the cooling fin" and already filed a patent application thereof (e.g., Japanese patent application No. 2007-322831). This cooling fin integrally consists of a plurality of fin portions arranged in rows and a base portion that supports the fin portions. The shape of each fin portion in the coolant flowing direction is designed so that a root portion continuous to the base portion is straight and an edge portion is wavy or corrugated. To manufacture this cooling fin, firstly, the fin portions and the base portion are integrally formed by extruding into a comb-teeth and straight shape. Secondly, the edge portions of the fin portions made in straight shapes by extrusion are bent by a jig (pins) in a direction perpendicular to the extruding direction. This bending work is performed by inserting the jig (pins) into spaces or clearances between the fin portions. By this bending, the edge portions of the fin portions are corrugated along the coolant flowing direction.

CITATION LIST

Patent Literature

Patent Literature 1: JP 2007-110025A

SUMMARY OF INVENTION

Technical Problem

Meanwhile, in the cooling fin in the above application, if the spaces between the fin portions are somewhat different in size from each other, the following disadvantages may be caused. When the edge portions of the fin portions are to be bent by the jig (pins), the side surfaces of the jig (pins) inserted in the spaces may hit one sides of the fin portions. Thus, the jig (pins) receives bending stress and may be broken. Further, after the fin portions are bent, the jig (pins) may adhere to the fin portions and become hard to pull out therefrom. If the jig (pins) is forcedly pulled, the jig (pins) receives bending stress and tensile stress and may be broken.

The present invention has been made in view of the circumstances and has a purpose to provide a heat exchanger capable of prompting a turbulent flow of coolant to enhance cooling performance without needing to consider the durability of the jig, and a method of manufacturing the heat exchanger.

Solution to Problem (1) To achieve the above purpose, one aspect of the invention provides a heat exchanger comprising a cooling fin including a plurality of fin portions and a base portion that supports the fin portions, wherein a plurality of pins each having a wider width than a space between the fin portions formed in parallel straight shapes are press-fitted into the space in a direction from a top end of the fin portions toward the base portion, the fin portions being plastically deformed into corrugated shapes and the pins being fixed between the fin portions and in positions spaced apart from the base portion.

According to the above configuration (1), the pins for plastic-deforming the fin portions into the corrugated shapes are press-fitted into the space between the fin portions and left therein. Thus, there is no need to pull out those pins from the space. This heat exchanger is brought into direct or indirect contact with a heating element and the coolant is supplied to flow in the space. Accordingly, the heat generated in the heating element is dissipated into the coolant through the fin portions. Further, in the space between the adjacent fin portions made in the corrugated shapes, a constricted area and a bulging area are provided. Thus, the coolant flowing through such space is made turbulent. In addition, the pins are placed in an upper end area of the space, so that the coolant flowing through the space is also made turbulent when coming across the pins in the upper end area of the space.

(2) To achieve the above purpose, in the above configuration (1), preferably, the space between the fin portions is provided in plural, the pins are arranged at intervals in each space in a longitudinal direction of each space, and the pins in the adjacent spaces are placed with a displacement in alternating pattern.

According to the above configuration (2), in addition to the operations of the above configuration (1), the constricted areas and the bulging areas are arranged alternately in the longitudinal direction in each space between the adjacent fin portions each formed with plural corrugations arranged at intervals in the longitudinal direction. Accordingly, the coolant flowing through the spaces is made turbulent repeatedly. In the upper end area of each space, the pins are arranged at intervals in the longitudinal direction of each space. The coolant flowing through the spaces are therefore made turbulent repeatedly when comes across the pins in the upper end areas of the spaces.

(3) To achieve the above purpose, in the above configuration (1) or (2), preferably, each pin has a taper shape in at least a leading end portion.

According to the above configuration (3), in addition to the operations of the above configuration (1) or (2), each pin can be smoothly press-fitted into the spaces between the fin portions by the taper shapes of the pins.

(4) To achieve the above purpose, in the above configuration (1) or (2), preferably, each pin is configured as a screw having a taper shape in at least a leading end, each screw being press-fitted into the spaces by screwing.

According to the above configuration (4), in addition to the operations of the above configuration (1) or (2), unlike in the case where pins are simply press-fitted into spaces between fin portions, the screws are screwed in between the fin portions so that the screws are press-fitted into the spaces, thereby bending and plastically deforming the fin portions into corrugated shapes. Herein, as long as a small torque is applied to the screws by a screw driver, thrust and wedging force resulting from the taper shape are applied to the screws.

(5) To achieve the above purpose, another aspect of the invention provides a method of manufacturing a heat exchanger comprising a cooling fin including a plurality of fin portions and a base portion supporting the fin portion, the method comprising the steps of: extruding the cooling fin so that the fin portions are formed in parallel straight shapes; and press-fitting a plurality of pins each having a wider width than a space between the fin portions of the extruded cooling fin into the space in a direction from a top end of the fin portions toward the base portion to form the fin portions into corrugated shapes by plastic deformation and fix the pins between the fin portions and in positions apart from the base portion.

According to the above configuration (5), the pins for plastic-deforming the fin portions into the corrugated shapes are press-fitted into the space between the fin portions and left therein. Thus, there is no need to pull out those pins from the space. This heat exchanger is brought into direct or indirect contact with a heating element and the coolant is supplied to flow in the space. Accordingly, the heat generated in the heating element is dissipated into the coolant through the fin portions. Further, in the space between the adjacent fin portions made in the corrugated shapes, a constricted area and a bulging area are provided. Thus, the coolant flowing through such space is made turbulent. In addition, the pins are placed in an upper end area of the space, so that the coolant flowing through the space is also made turbulent when coming across the pins in the upper end area of the space.

(6) To achieve the above purpose, in the above configuration (5), preferably, the space between the fin portions is provided in plural, the pins are arranged in each space at intervals in a longitudinal direction of each space, and the pins placed in adjacent spaces are placed with a displacement in alternating pattern.

According to the above configuration (6), in addition to the operations of the above configuration (5), the constricted areas and the bulging areas are arranged alternately in the longitudinal direction in each space between the adjacent fin portions each formed with plural corrugations arranged at intervals in the longitudinal direction. Accordingly, the coolant flowing through the spaces is made turbulent repeatedly. In the upper end area of each space, the pins are arranged at intervals in the longitudinal direction of each space. The coolant flowing through the spaces are therefore made turbulent repeatedly when comes across the pins in the upper end areas of the spaces.

(7) To achieve the above purpose, in the above configuration (5) or (6), preferably, each pin has a taper shape in at least a leading end portion.

According to the above configuration (7), in addition to the operations of the above configuration (5) or (6), each pin can be smoothly press-fitted into the spaces between the fin portions by the taper shapes of the pins.

(8) To achieve the above purpose, in the above configuration (5) or (6), preferably, each pin is configured as a screw having a taper shape in at least a leading end, each screw being press-fitted into the spaces by screwing.

According to the above configuration (8), in addition to the operations of the above configuration (5) or (6), unlike in the case where pins are simply press-fitted into spaces between fin portions, the screws are screwed in between the fin portions so that the screws are press-fitted into the spaces, thereby bending and plastically deforming the fin portions into corrugated shapes. Herein, as long as a small torque is applied to the screws by a screw driver, thrust and wedging force resulting from the taper shape are applied to the screws.

Advantageous Effects of Invention

According to the above configuration (1), there is no need to consider durability of the jig during manufacturing and therefore rigidity and strength in the structure can be enhanced by the pins left between the fin portions. Further, the coolant is caused to flow through the space between the fin portions, so that the coolant is prompted to form a turbulent flow, thereby increasing an amount of heat to be dissipated from each fin portion into the coolant. Thus, the cooling performance can be increased.

According to the above configuration (2), in addition to the advantages of the above configuration (1), the turbulent flow of coolant flowing through the spaces is made turbulent repeatedly and hence a turbulent flow can be further induced. This makes it possible to further improve the cooling performance.

According to the above configuration (3), in addition to the advantages of the above configuration (1) or (2), the pins can be easily press-fitted into the spaces between the fin portions.

According to the above configuration (4), in addition to the advantages of the above configuration (1) or (2), there is no need to apply a larger axial force than is necessary to the screws for the purpose of press-fitting the screws into the space(s) between the fin portions. It is therefore possible to prevent the screws from dropping out from the space(s) between the fin portions.

According to the above configuration (5), there is no need to consider durability of the jig during manufacturing and therefore rigidity and strength in the structure can be enhanced by the pins left between the fin portions. Further, the coolant is caused to flow through the space between the fin portions, so that the coolant is prompted to form a turbulent flow, thereby increasing an amount of heat to be dissipated from each fin portion into the coolant. Thus, the cooling performance can be increased.

According to the above configuration (6), in addition to the advantages of the above configuration (5), the turbulent flow of coolant flowing through the spaces is made turbulent repeatedly and hence a turbulent flow can be further induced. This makes it possible to further improve the cooling performance.

According to the above configuration (7), in addition to the advantages of the above configuration (5) or (6), the pins can be easily press-fitted into the spaces between the fin portions.

According to the above configuration (8), in addition to the advantages of the above configuration (5) or (6), there is no need to apply a larger axial force than is necessary to the screws for the purpose of press-fitting the screws into the space(s) between the fin portions. It is therefore possible to prevent the screws from dropping out from the space(s) between the fin portions.

DESCRIPTION OF EMBODIMENTS

<First Embodiment>

A detailed description of a first preferred embodiment of the present invention, embodying a heat exchanger and a manufacturing method thereof, will now be given referring to the accompanying drawings.

Figure 1:
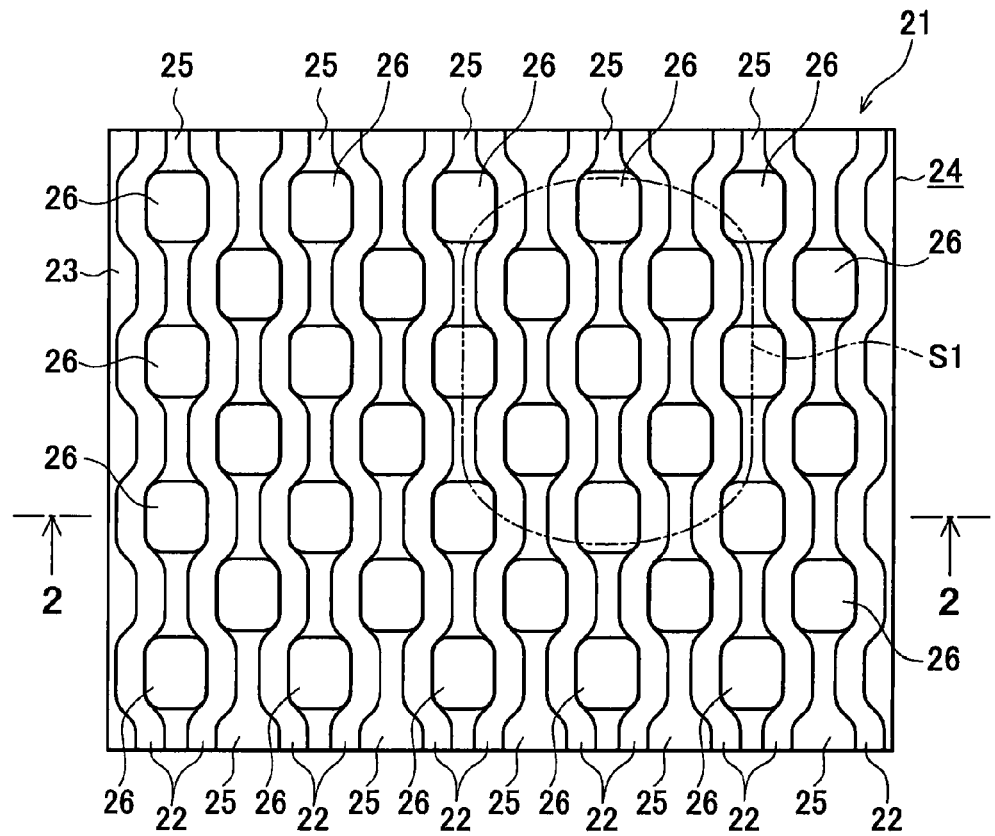
FIG. 1 is a plan view of a heat exchanger in a first embodiment.
Figure 2:
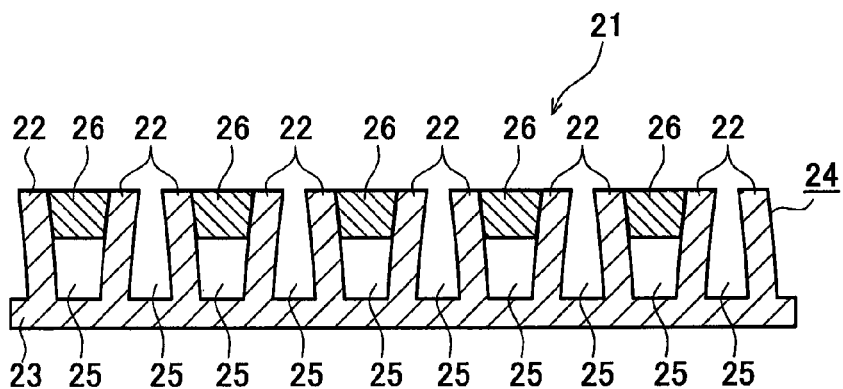
FIG. 2 is a cross-sectional view of the heat exchanger taken along a line 2-2 in FIG. 1, in the first embodiment.
Figure 3:
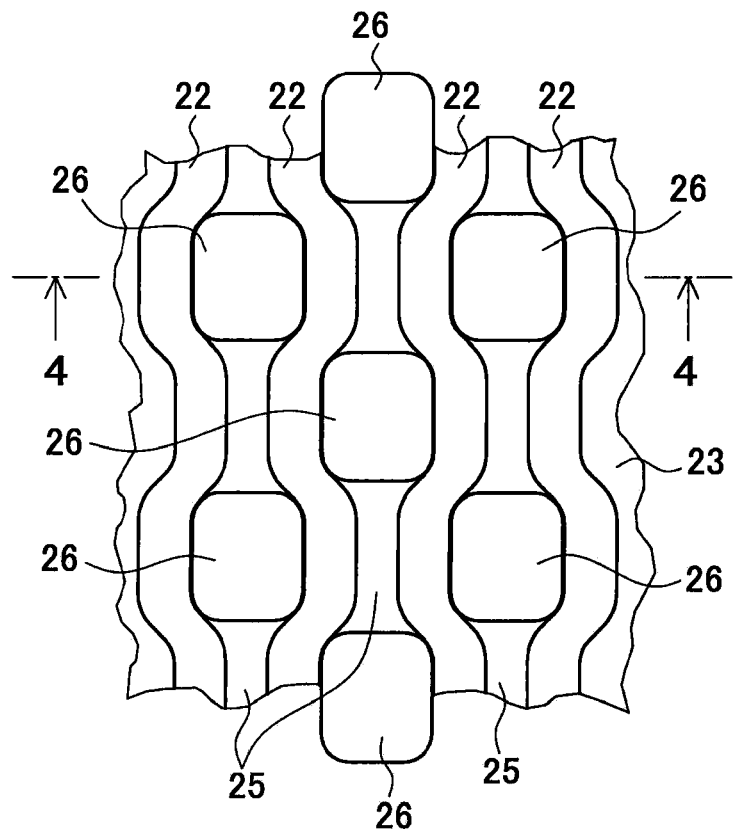
FIG. 3 is an enlarged plan view showing a part of the heat exchanger circled with an elliptic chain line in FIG. 1, in the first embodiment.
Figure 4:
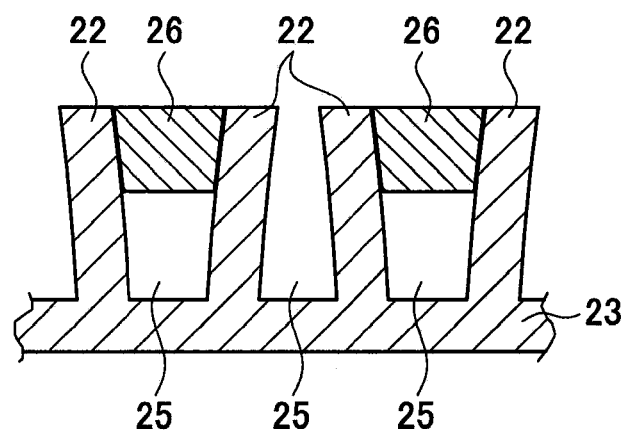
FIG. 4 is a cross-sectional view of the heat exchanger taken along a line 4-4 in FIG. 3, in the first embodiment.

FIG. 1 is a plan view of a heat exchanger 21 in this embodiment. FIG. 2 is a cross-sectional view of the heat exchanger 21 taken along a line 2-2 in FIG. 1. FIG. 3 is an enlarged plan view showing only a part of the heat exchanger 21 circled by an elliptic chain line S1 in FIG. 1. FIG. 4 is a cross-sectional view of the heat exchanger 21 taken along a line 4-4 in FIG. 3.

As shown in FIGS. 1 to 4, this heat exchanger 21 includes a cooling fin 24 made of aluminum or aluminium consisting of a plurality of fin portions 22 and a base portion 23 supporting the fin portions 22. In this heat exchanger 21, the fin portions 22 are formed in straight parallel shapes, and a plurality of pins 26 each having a wider width than spaces 25 each formed between the fin portions 22 are press-fitted into the spaces 25 in a direction from a top end (a distal end) of each fin portion 22 toward the base portion 23. Accordingly, the fin portions 22 are plastically deformed into corrugated or wavy configuration, so that the pins 26 are fixed between the fin portions 22 and in positions spaced apart from the base portion 23. As shown in FIGS. 2 and 4, each pin 26 is press-fitted between only top end portions of the fin portions 22. Accordingly, parts of the adjacent fin portions 22 in which the pins 26 are press-fitted are plastically deformed into an almost V-shape toward the base portion 23.

As shown in FIGS. 1 to 4, the spaces 25 between the fin portions 22 are provided in plural. In each space 25, the pins 26 are arranged at equal intervals in the longitudinal direction of each space 25. The pins 26 in the adjacent spaces 25 are placed with a displacement in an alternating pattern. Since the pins 26 are arranged regularly with respect to the cooling fin 24, the fin portions 22 are formed in regularly corrugated shapes.

Each pin 26 is made of aluminum or aluminium and designed to have an almost rectangular shape in plan view and side surfaces tapered as shown in FIGS. 2 and 4. Accordingly, because of the tapered side surfaces, each pin 26 is smoothly press-fitted into the spaces 25 between the adjacent fin portions 22. This can facilitate press-fitting of each pin 26 into the spaces 25 between the adjacent fin portions 22.

Figure 5:
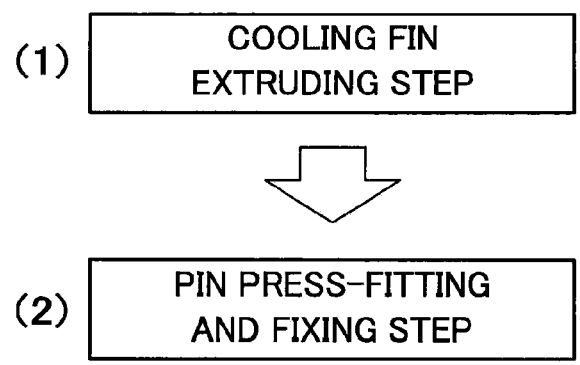
FIG. 5 is a flowchart showing a method of manufacturing the heat exchanger in the first embodiment.
Figure 6:
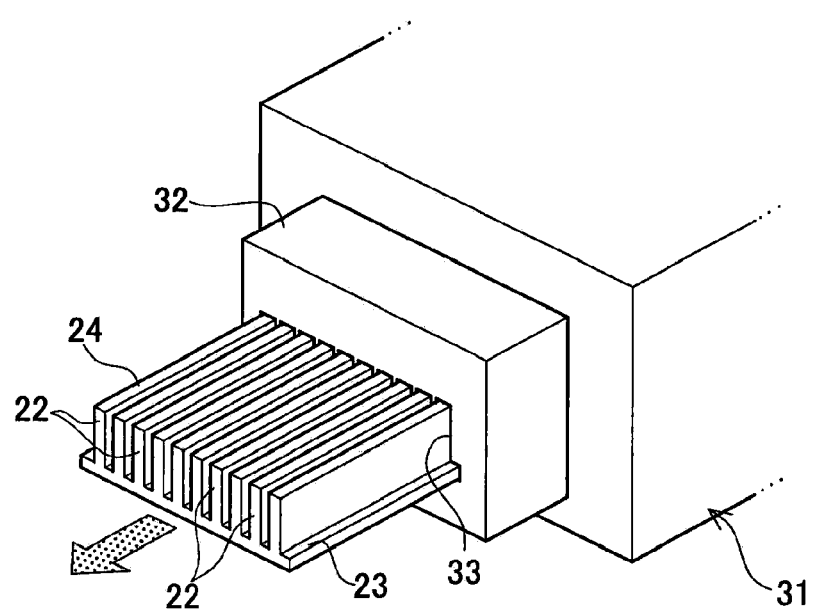
FIG. 6 is a perspective view showing a process of extruding a cooling fin in the first embodiment.
Figure 7:
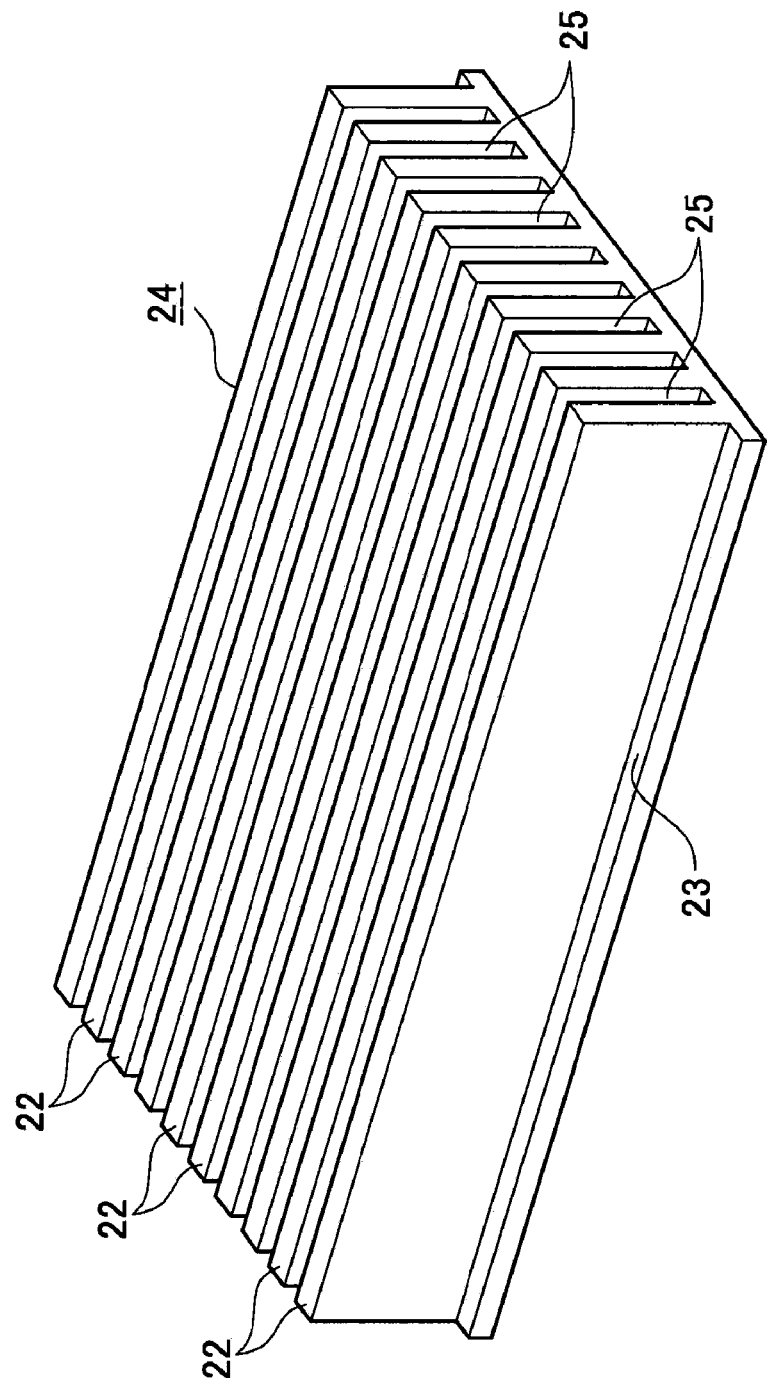
FIG. 7 is a perspective view showing the cooling fin just after extrusion in the first embodiment.
Figure 8:
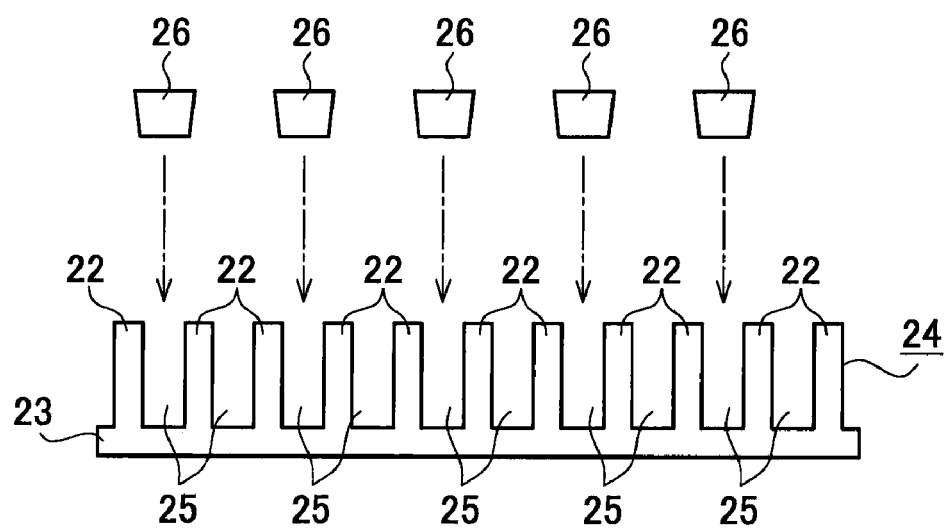
FIG. 8 is a front view showing a process of press-fitting pins into spaces between fin portions extruded into straight shapes in the first embodiment.

A method of manufacturing the aforementioned heat exchanger 21 will be explained below. FIG. 5 is a flowchart showing this manufacturing method. FIG. 6 is a perspective view showing a process of extruding the cooling fin 24. FIG. 7 is a perspective view of the cooling fin 24 just after extrusion. FIG. 8 is a front view showing a process of press-fitting the pins 26 into the spaces 25 between the fin portions 22 formed in straight shapes by extrusion.

To manufacture this heat exchanger 21, firstly, a "cooling fin extruding step" (1) in FIG. 5 is performed. In this step, specifically, the cooling fin 24 is produced by extrusion to form the fin portions 22 in parallel straight shapes. This step is carried out by use of for example a die 32 of an extruding machine 31 as shown in FIG. 6 to integrally extrude the straight fin portions 22 and the base portion 23 through a comb-shaped through hole 33. By this step, the cooling fin 24 is obtained as shown in FIG. 7 in which the fin portions 22 are formed in parallel straight shapes on the flat base portion 23.

Secondly, a "pin press-fitting and fixing step" (2) in FIG. 5 is performed. In this step, specifically, as shown in FIG. 8, the pins 26 wider than the spaces 25 are press-fitted, in a direction from the top end of each fin portion 22 toward the base portion 23, into the spaces 25 between the fin portions 22 extruded in straight shapes. Thereby, the fin portions 22 are plastically deformed into the corrugated shapes as shown in FIGS. 1 and 3. Simultaneously, the pins 26 are fixed between the fin portions 22 and in positions spaced apart from the base portion 23 as shown in FIGS. 2 and 4. By this step, as shown in FIGS. 1 and 2, the heat exchanger 24 is obtained with the fin portions 22 formed in corrugated shapes by the pins 26.

According to the heat exchanger 21 and the manufacturing method thereof in this embodiment explained above, the pins 26 for plastically deforming the fin portions 22 into corrugated shapes are press-fitted and left in the spaces 25 between the fin portions 22. There is no need to pull out the pins 26 from the spaces 25. Accordingly, there is no possibility as in the conventional example that the jig (pin) is broken when the jig (pins) is inserted in the spaces between the fin portions and hits one sides of the fin portions or when the jig (pins) is forcedly pulled out. It is therefore unnecessary to take into account durability of the jig (pin) during manufacturing. The pins 26 left in the spaces 25 between the fin portions 22 can also enhance rigidity and strength in the structure of the heat exchanger 21.

According to the manufacturing method of the heat exchanger 21 in this embodiment, the pins 26 can be press-fitted at the same time into the spaces 25 between the fin portions 22 of the cooling fin 24 made by extrusion. For instance, the pins 26 can be press-fitted simultaneously in such a manner that only leading end portions of the pins 26 are temporarily inserted into the spaces 25 of the cooling fin 24 and then the pins 26 are pressed down together from above by a pressurizer or the like. Accordingly, as compared with the case where the pins 26 are individually press-fitted, the process can be simplified.

Figure 9:
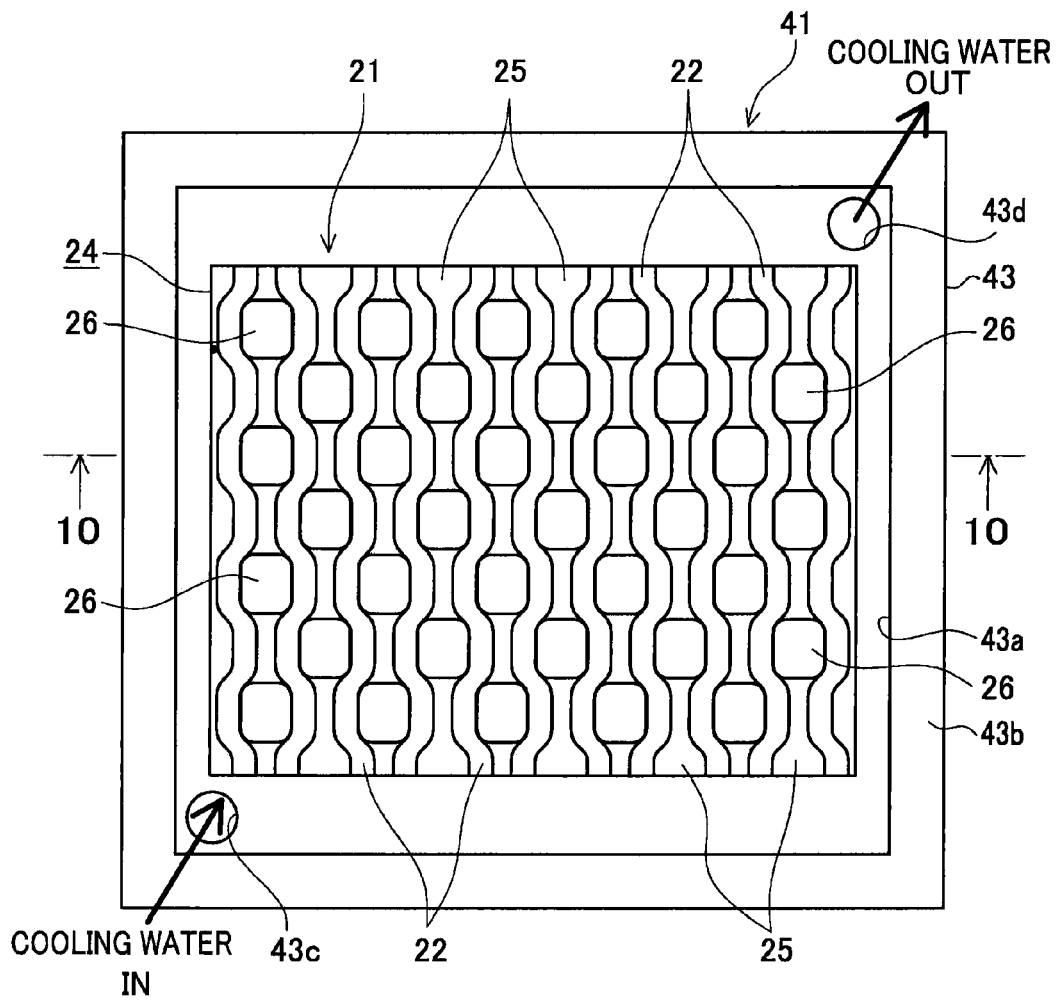
FIG. 9 is a plan view showing a part of structure of a cooling device in the first embodiment.
Figure 10:
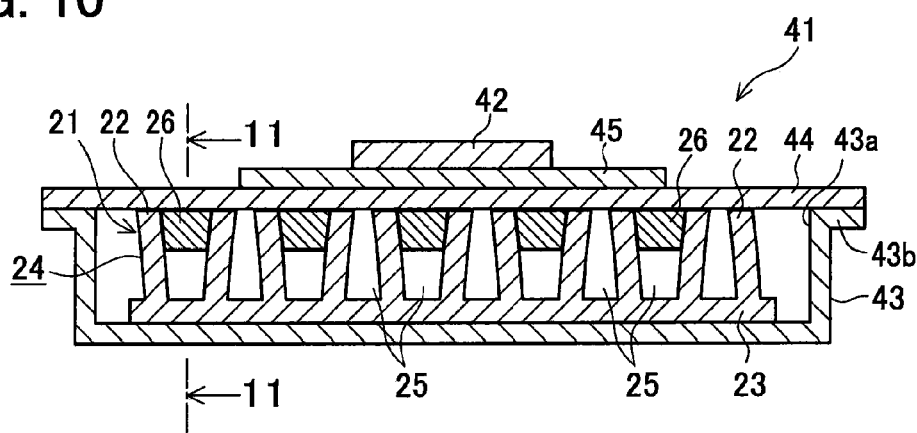
FIG. 10 is a cross-sectional view showing the whole cooling device taken along a line 10-10 in FIG. 9 in the first embodiment.
Figure 11:
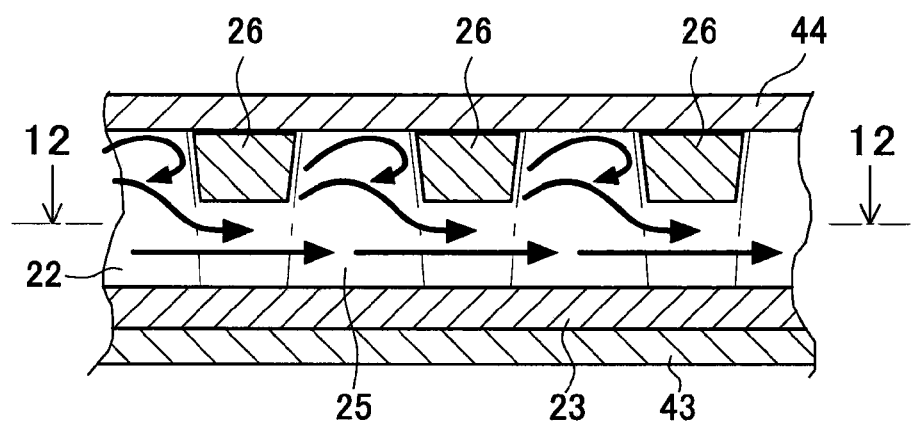
FIG. 11 is a cross-sectional view showing a part of the cooling device taken along a line 11-11 in FIG. 10 in the first embodiment.
Figure 12:
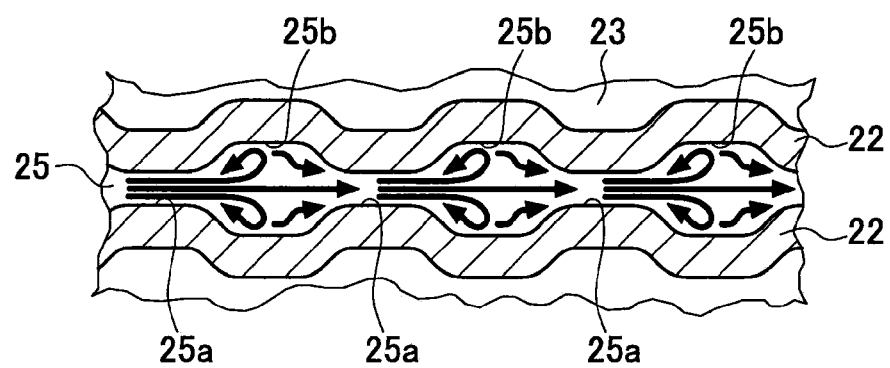
FIG. 12 is a cross-sectional view showing a part of the cooling device taken along a line 12-12 in FIG. 11 in the first embodiment.

A cooling device using the aforementioned heat exchanger 21 is explained below. FIG. 9 is a plan view showing a part of a cooling device 41 in this embodiment. FIG. 10 is a cross-sectional view of the whole cooling device 41 taken along a line 10-10 in FIG. 9. FIG. 11 is a cross-sectional view of a part of the cooling device 41 taken along a line 11-11 in FIG. 10. FIG. 12 is a cross-sectional view of a part of the cooling device 41 taken along a line 12-12 in FIG. 11.

As shown in FIG. 10, the cooling device 41 in this embodiment is configured to cool a high-heat generating semiconductor element 42 used for power conversion and mounted in a hybrid electric vehicle, an electric vehicle, and others. This cooling device 41 includes a cooling case 43 having a bottom-closed shallow box shape, rectangular in plan view, the heat exchanger 21 oriented with the base portion 23 downward and housed in the cooling case 43, a cover 44 covering an upper opening 43a of the cooling case 43 containing the heat exchanger 21, and a heat spreader 45 fixed on an upper surface of the cover 44. The high-heat generating semiconductor element 41 is fixed on an upper surface of the heat spreader 45. As shown in FIGS. 9 and 10, the cooling case 43 includes a flange 43b protruding from a periphery on an upper side. The cover 44 is bonded by "brazing" onto an upper surface of this flange 43b and an upper surface (a side on which the pins 26 appear) of the heat exchanger 21. In this bonded state, the spaces 25 between the fin portions 22 are closed by the cover 44, thereby providing flow paths for cooling water serving as coolant. Further, a bottom wall of the cooling case 43 is formed with an inlet 43c for introducing cooling water and an outlet 43 for discharging the cooling water.

According to the cooling device 41 mentioned above, when the cooling water is supplied into the cooling case 43 through the inlet 43c, the cooling water flows through the spaces 25 between the fin portions 22 and then is discharged to the outside through the outlet 43d. At that time, the heat generated in the semiconductor 42 is released into the cooling water flowing through the spaces 25 via the heat spreader 45, the cover 44, and the fin portions 22. By this heat dissipation, the semiconductor element 42 is cooled.

Since this cooling device 41 uses the aforementioned heat exchanger 21, each of the fin portions 22 includes a plurality of corrugated shapes arranged at predetermined intervals in the longitudinal direction of the fin portions 22 as shown in FIG. 12. In each of the spaces 25 between the fin portions 22, therefore, constricted areas 25a and bulging areas 25b are alternately provided in the longitudinal direction. Accordingly, the cooling water flowing through each space 25 is repeatedly made turbulent in the bulging areas 25b as indicated by thick arrows in FIG. 12. Further, the turbulent flows may also occur in the constricted areas 25a. Consequently, the amount of heat to be dissipated from each fin portion 22 into the cooling water can be increased by the turbulent flows of cooling water. This can enhance the cooling performance of the heat exchanger 21.

In addition, as shown in FIG. 11, in the upper end areas of the spaces 25 mentioned above, the pins 26 are arranged at predetermined intervals in the longitudinal direction of each space 25. Thus, the cooling water flowing through each space 25 is repeatedly made turbulent in the upper end area of each space 25 when the cooling water goes across the pins 26 as indicated by thick arrows in FIG. 11. This makes it possible to prompt turbulent flows of the cooling water in each space 25. The amount of heat to be dissipated from each fin portion 22 into the cooling water can be further increased. Therefore, the cooling performance of the heat exchanger 21 can be more enhanced.

In the cooling device 41 using the heat exchanger 21 in this embodiment, the corrugated shapes of the fin portions 22 can achieve the advantage of prompting the turbulent flows of cooling water. The pins 26 can also provide the advantage of further prompting the turbulent flows of cooling water. Those two types of turbulent prompting effects act synergistically to enhance the cooling performance of the heat exchanger 21 and the cooling device 41.

<Second Embodiment>

A second embodiment of a heat exchanger and a manufacturing method thereof according to the present invention will be explained below in detail referring to accompanying drawings.

In the following explanation, similar or identical parts to those in the first embodiment are given the same reference signs and will not be explained in detail. The following explanation is therefore made with a focus on differences from the first embodiment.

Figure 13:
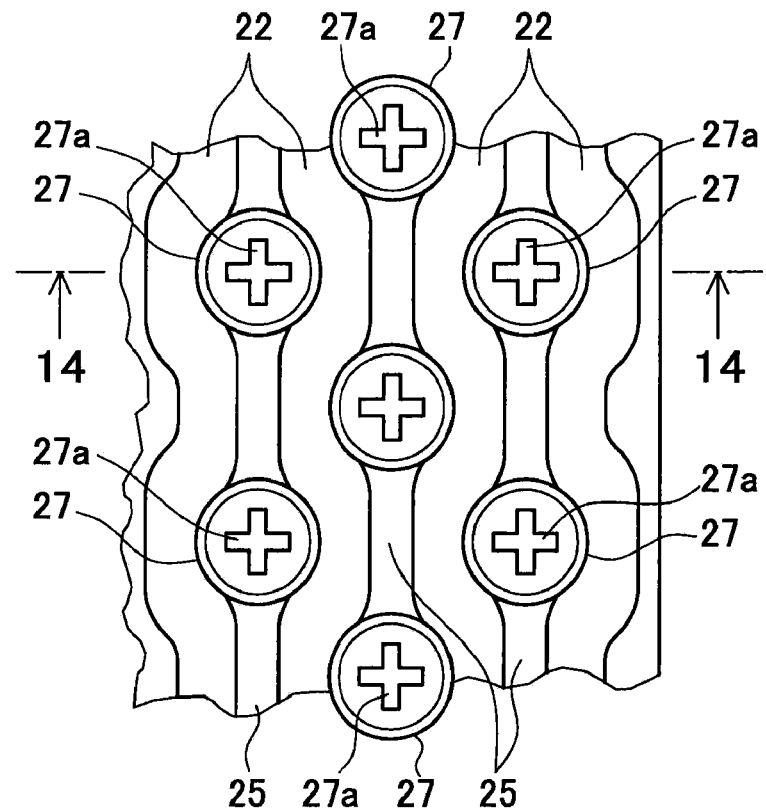
FIG. 13 is a partial enlarged plan view showing a heat exchanger in a second embodiment, corresponding to FIG. 3.
Figure 14:
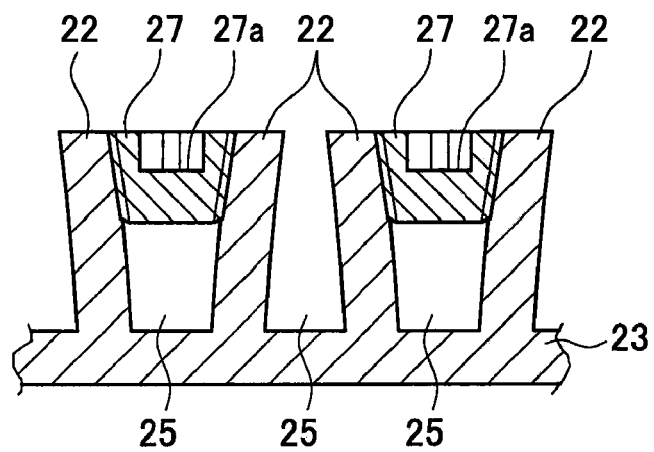
FIG. 14 is a cross-sectional view of the heat exchanger taken along a line 14-14 in FIG. 13 in the second embodiment.

FIG. 13 is a partial enlarged plan view of the heat exchanger in this embodiment, corresponding to FIG. 3. FIG. 14 is a cross-sectional view of the heat exchanger taken along a line 14-14 in FIG. 13. This embodiment differs from the first embodiment in the configuration of a plurality of pins. In this embodiment, specifically, a plurality of taper screws 27 are used as the pins. Each taper screw 27 is formed, on its top, with a cross groove 27a as shown in FIG. 13. Each taper screw 27 has a tapered outer shape as shown in FIG. 14. Those taper screws 27 are press-fitted by screwing into spaces 25 between adjacent fin portions 22. Other configurations in this embodiment are substantially the same as those in the first embodiment.

According to the heat exchanger in this embodiment, unlike in the case where the pins are simply press-fitted into the spaces 25 between the fin portions 22, the taper screws 27 are screwed between the fin portions 22 and thus press-fitted into the spaces 25. Thereby the adjacent fin portions 22 are bent and plastically deformed into the corrugated shapes. Herein, as long as a small torque is applied to the screws 27 by use of a screw driver, the thrust and the wedging force resulting from the taper shapes are given to the taper screws 27. It is therefore unnecessary to apply a larger axial force than is needed to the taper screws 27 in order to press-fit the taper screws 27 into the spaces 25 between the fin portions 22. After press-fitting, threads of the taper screws 27 engage the fin portions 22. This prevents the taper screws 27 from thereafter dropping out from between the fin portions 22.

The other operations and advantages of the heat exchanger and the manufacturing method thereof in this embodiment and the operations and advantages of the cooling device using the heat exchanger in this embodiment are fundamentally identical to those in the first embodiment.

The present invention is not limited to the above embodiments but may be embodied in other specific forms without departing from the essential characteristics thereof.

Figure 15:
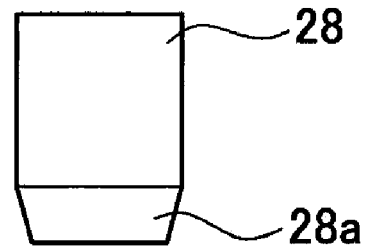
FIG. 15 is a front view of a pin in another embodiment.

The above embodiments use the pins 26 or the taper screws 27, each having the tapered outer shape. Alternatively, as shown in a front view in FIG. 15, a pin 28 or a screw in which only a leading end portion 28a of a side surface is tapered may be used.

INDUSTRIAL APPLICABILITY

The present invention can be used in a cooling device to cool a power converter to be mounted in a hybrid electric vehicle, an electric vehicle, and others.

REFERENCE SIGNS LIST

21 Heat exchanger
22 Fin portion
23 Base portion
24 Cooling fin
25 Space
25a Constricted area
25b Bulging area
26 Pin
27 Taper screw (Pin)
28 Pin
28a Leading end portion

The invention claimed is:

1. A method of manufacturing a heat exchanger comprising a cooling fin including a plurality of fin portions and a base portion supporting the fin portion, the method comprising the steps of:

extruding the cooling fin so that the fin portions are formed in parallel straight shapes; and press-fitting a plurality of pins each having a wider width than a space between the fin portions of the extruded cooling fin into the space in a direction from a top end of the fin portions toward the base portion to form the fin portions into corrugated shapes by plastic deformation and fix the pins between the fin portions and in positions apart from the base portion.

2. The method of manufacturing a heat exchanger according to claim 1, wherein the space between the fin portions is provided in plural, the pins are arranged in each space at intervals in a longitudinal direction of each space, and the pins placed in adjacent spaces are placed with a displacement in alternating pattern.

3. The method of manufacturing a heat exchanger according to claim 1, wherein each pin has a taper shape in at least a leading end portion.

4. The method of manufacturing a heat exchanger according to claim 1, wherein each pin is configured as a screw having a taper shape in at least a leading end, each screw being press-fitted into the spaces by screwing.

5. The method of manufacturing a heat exchanger according to claim 2, wherein each pin has a taper shape in at least a leading end portion.

6. The method of manufacturing a heat exchanger according to claim 2, wherein each pin is configured as a screw having a taper shape in at least a leading end, each screw being press-fitted into the spaces by screwing.

* * * * *